United States Patent [19]

Nelson et al.

[11] 4,176,369
[45] Nov. 27, 1979

[54] IMAGE SENSOR HAVING IMPROVED MOVING TARGET DISCERNMENT CAPABILITIES

[75] Inventors: Richard D. Nelson, Santa Ana; A. James Hughes, Tustin, both of Calif.

[73] Assignee: Rockwell International Corporation, El Segundo, Calif.

[21] Appl. No.: 857,633

[22] Filed: Dec. 5, 1977

[51] Int. Cl.$^2$ .................... H01L 29/78; H01L 31/00
[52] U.S. Cl. .................................. 357/24; 250/211 J; 307/221 D; 357/30
[58] Field of Search ................ 307/221 D; 357/24, 30

[56] References Cited

U.S. PATENT DOCUMENTS

| | | | |
|---|---|---|---|
| 3,806,729 | 4/1974 | Caywood | 357/24 |
| 3,851,096 | 11/1974 | Collins et al. | 357/24 |
| 3,863,065 | 1/1975 | Kosonocky | 357/24 |
| 3,865,722 | 2/1975 | Carnes | 357/24 |
| 3,906,543 | 9/1975 | Smith et al. | 357/30 |
| 3,932,775 | 1/1976 | Kosonocky | 357/24 |
| 3,940,602 | 2/1976 | Lagnado et al. | 357/30 |
| 3,964,083 | 6/1976 | Lohstroh | 357/30 |
| 3,971,003 | 7/1976 | Kosonocky | 357/24 |
| 3,979,604 | 9/1976 | Bate | 357/24 |
| 3,983,395 | 9/1976 | Kim | 357/24 |
| 3,983,573 | 9/1976 | Ishihara | 357/24 |
| 3,996,599 | 12/1976 | King | 357/24 |

OTHER PUBLICATIONS

Gray et al., Inter. Conf. Tech. Appl. CCD, U. of Edinburgh, Sep. 1974, pp. 162-167.
Chai et al., IBM Tech. Discl. Bulletin, vol. 18, No. 7, Dec. 1975, pp. 2159-2161.

Primary Examiner—William D. Larkins
Attorney, Agent, or Firm—H. Fredrick Hamann; Gilbert H. Friedman

[57] ABSTRACT

A semiconductor image sensor comprises an array of charge collection elements buried within the semiconductor for collecting charge photogenerated in response to the image. This sensor is easily configured to discern changes in an image. One or more charge transfer devices (CTD's) of an array are associated with each column of charge collection elements. For readout, the charge collected by each charge collection element is transferred to an associated storage cell of an array CTD associated with the column in which that charge collection element is disposed.

For discernment of moving targets or image changes, a difference between the charge collected by a given charge collection element during a first frame and a second frame is determined. To discern a moving target, each column of charge collection elements has a first and a second array CTD associated therewith and a first image frame of charge is collected, transferred to and stored in the channels of the first array CTD's, after which a second image frame of charge is collected, transferred to and stored in the channels of the second array CTD's. The charges in the first and second array CTD's are then read out in parallel, thereby transferring the image frames in parallel. Output CTD channels positioned to accept charge from the channels of the array CTD's have special charge transfer control structures for transferring the charge from the channels of the array's first CTD's to the channel of a first output CTD and from the channels of the array's second CTD's to the channel of a second output CTD to ensure that parallel transfer of the image frames continues in the output CTD's. This parallel in the array, parallel in the output (parallel-parallel) CTD transfer architecture minimizes interframe cross-talk and maximizes resolution. Interleaved first and second array CTD's to which charge may be selectively transferred are achieved by splitting the propagation electrodes for one phase into two electrodes each in order to control charge transfer from the charge collectors to the first and second associated CTD's independently.

The CTD's (array and output together) may be combined with a prior art single-frame-at-a-time imager to form a system which appears (at the external system output) to be the same as the monolithic structure.

7 Claims, 10 Drawing Figures

IMAGE SENSOR HAVING IMPROVED MOVING TARGET DISCERNMENT CAPABILITIES

The invention herein described was made in the course of or under a contract or subcontract thereunder, with the Air Force.

BACKGROUND OF THE INVENTION

1. Field of the Invention

The invention relates to the field of image sensors and is particularly, but not exclusively, useful in the field of image sensing systems designed to discern changes in an image being sensed.

2. Prior Art

There are many situations in which it is desirable to electronically sense images. In some circumstances it is desired to perceive an image as a whole at a selected moment in time. In other circumstances the primary desire is to discern changes in the image during a selected period of time rather than to perceive the entire image at a given moment.

There are many image sensors in the prior art. However, most, if not all, of them which are capable of sensing a complete image require elaborate post-sensing data processing in order to discern image variations. One prior art technique for discerning image variations has been to sense an initial image frame of the scene to be viewed and store that initial image frame in an external memory and use that initial image as a reference to compare against subsequently sensed image frames of the same scene to determine any differences between the initial frame and the subsequent frames. Subtracting the detected image intensity of the subsequent frame from the detected image intensity of the initial frame on a picture element by picture element basis yields a non-zero result for each picture element which received detectably different intensities of response-inducing radiation in the two frames. Such systems are highly complex in that they require a memory capable of storing an entire electrical representation of an initial image frame without suffering a significant loss of intensity resolution and accuracy. The data processing system must be able either (1) to store the electrical representation of the subsequent image frame and then compare that electrical representation with the electrical representation of the initial frame or (2) to compare the electrical representation of the initial frame with the electrical representation of the subsequent frame in real time as the electrical representation of the subsequent frame is generated or received. Whichever of these techniques is utilized, resolution and accuracy are reduced. If digital memories are used, digitization reduces resolution and accuracy. If analog memories are used, the data from the two frames pass through different devices having non-identical characteristics and the resolution and accuracy are reduced. Such systems, although complex and expensive can be effective in achieving their intended purpose where the scene change which is to be discerned is of an intensity level which makes the change easy to discern. However, due to the complex nature of the signal processing required by these systems, their sensitivity to scene changes which are of a low intensity level or involve a small change in a high intensity level is less than optimum.

An image sensor and image sensing system suitable both for perceiving entire images and for moving target or image change discernment is needed which has a reduced complexity and cost and an improved sensitivity to small intensity changes and to the movement of low intensity targets in a high intensity background.

SUMMARY

The deficiencies of prior art image sensors are in large part overcome in a semiconductor device of the present invention by collecting, in an array of charge collection elements buried within the semiconductor material, charges which are photogenerated in response to the image. Each charge collection element detects the radiation from one picture element (pixel) of the image. The charge collected on (detected by) each buried charge collection element of the array is periodically transferred to a charge transfer device (CTD) storage cell associated with that charge collection element for transfer to output structures which provide externally usable signals. Moving target (or image change) discernment may be advantageously provided by employing multiple frame storage for each charge collection element by associating a plurality of CTD storage cells with each charge collection element (charge collector). Moving objects may be discerned by, on a pixel by pixel basis, performing a charge difference operation on the charge collected during two different frames. This provides non-zero data for each picture element which had a detectably different actinic radiation intensity in the initial frame than it had in the subsequent frame and thereby provides a means of identifying those portions of the image which are changing while ignoring any fixed background, independent of what that background is. Interframe crosstalk is minimized and resolution and accuracy are maximized by (1) associating a plurality of CTD's with independent charge storage control with each column of charge collectors so that a different frame may be stored in each of the CTD's associated with a given column of charge collectors, and (2) by providing separate output CTD's for each frame and special charge transfer control structures so that charge representing different image frames may be transferred to different output CTD's. With such an architecture, frames may be transferred to the output of the system in parallel, with each CTD (both array and output) transporting charges collected from a single frame only, thereby preventing transfer-induced interframe crosstalk during transfer in the array CTD's and in the output CTD's.

Independent charge storage control may be obtained by splitting the electrodes of one propagation phase into a plurality of separate electrodes for storage control.

Externally provided first and second image frame data may be transferred sequentially into the CTD array and then processed in the same manner as though it had been sensed by the buried charge collection elements. In this way the CTD structure may be used with a prior art single frame-at-a-time imager to form a system which acts like the preferred monolithic device.

DETAILED DESCRIPTION OF THE PREFERRED EMBODIMENT

An image sensing device in accordance with the present invention is fabricated in a wafer of semiconductor or other material having the characteristics necessary for the proper functioning of the device. These characteristics will become apparent from the subsequent description of the preferred embodiment of the device and its operation.

Several of the operations performed by the invention are different, but can be referred to by the same or similar language. For clarity in the description, the ways in which "detect", "discern", "perceive", "actinic" and "sense" will be used are explained here.

The term "detect" is used with respect to the process or function of converting the incident energy into collected electrical charges representing the spacial variation of the actinic intensity of that energy.

The term "actinic" is used with respect to incident energy which generates, directly or indirectly, electric charges which the device can detect.

The term "discern" is used with respect to the process of extracting selected information from the image information provided by the detection process. Discernment may take place within the semiconductor chip or external to it, in accordance with overall system design.

The term "perceive" is used with respect to the reception of image information provided by the detection process and encompasses the reception of all of the image information or the reception of a lesser quantity of information which has been discerned, or both. Perception may take place within the semiconductor chip or external to it in accordance with overall system design.

The term "sense" is used with respect to the process of converting the actinic incident energy to an electrical signal or electrically-induced condition representative of the spacial variation of that actinic incident energy. The term sense is thus rather broad and can encompass as little as detection and as much as detection and much subsequent data processing in accordance with the type of information or signal desired.

Figure 1:
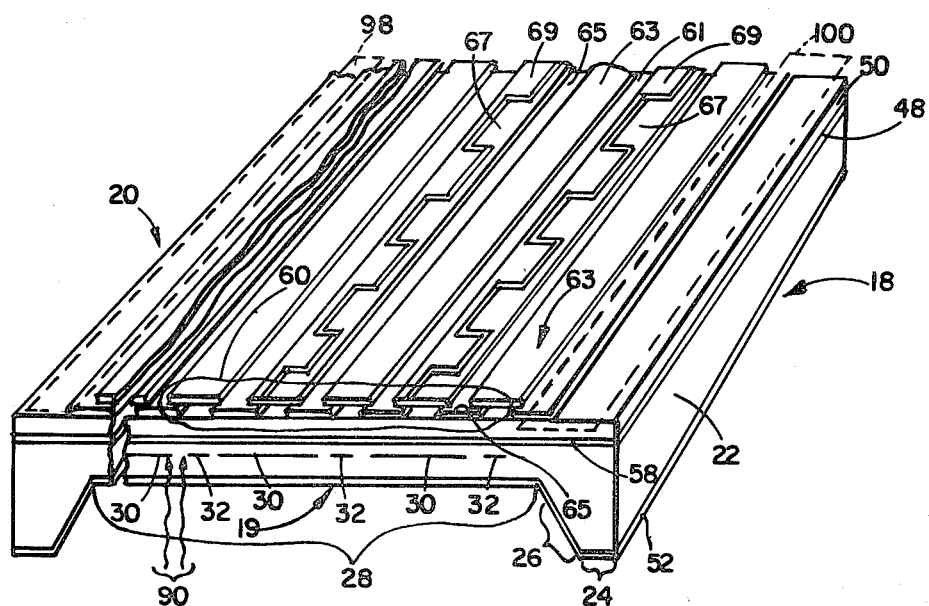
FIG. 1 is a perspective partially cut-away view of an image-sensing device in accordance with the invention.
Figure 6:
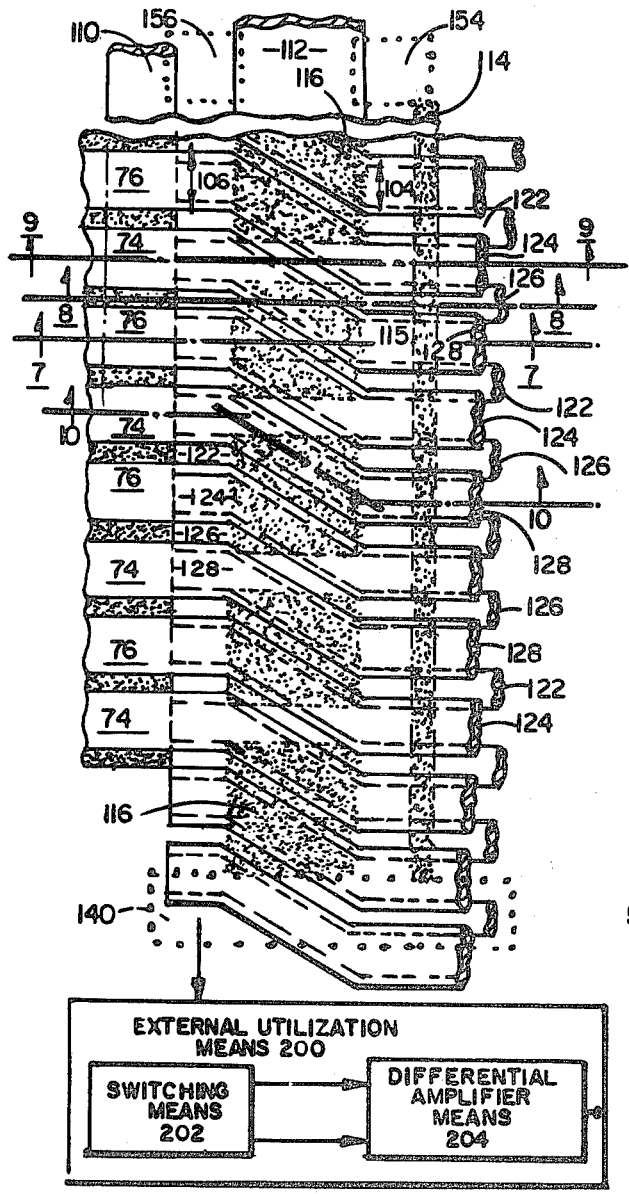
FIG. 6 is a simplified plan view of the output structure of the device of FIG. 2.

A preferred embodiment of an image sensor device 18 in accordance with the invention is illustrated in FIG. 1 in a perspective partially cutaway view. Briefly, sensor device 18 has an upper or front surface 20, a lower or back surface 19 designed to have the image to be sensed focused thereon and comprises a wafer or host material 22. The host material 22 has a thin segment 28 within which buried charge collection regions 30 (collectors) and charge collector isolation regions 32 are disposed. The upper surface of host material 22 has a dielectric layer 50 disposed thereon and a set 60 of charge transfer device (CTD) control electrodes (61, 63, 65, 67 and 69) disposed on the dielectric 50. A plurality of CTD channels are defined within the host material by channel stops (not shown in FIG. 1). The charge transfer channels and the channel stops run perpendicular to the length of the electrodes of set 60. The charge transfer channels, control electrodes, channel stops and such comprise a set 70 of charge transfer devices which receive image information in the form of charges collected by charge collectors 30. An array output structure 100 is disposed in the vicinity of the right hand boundary of sensor device 18 as illustrated in FIG. 1. Array output structure 100 receives image information from the charge transfer devices of set 70 in the form of charge packets and transports them to a device output region 140 as indicated in FIG. 6 where externally utilizable signals are provided. An array electrical input structure 98 is disposed in the vicinity of the left hand boundary of sensor device 18 as illustrated in FIG. 1.

The operation of this embodiment of the invention is briefly described at this point so that the purpose of, and the interrelation of, the various parts of the device structure may be more easily understood from the succeeding detailed description of the device structure.

Figure 5:
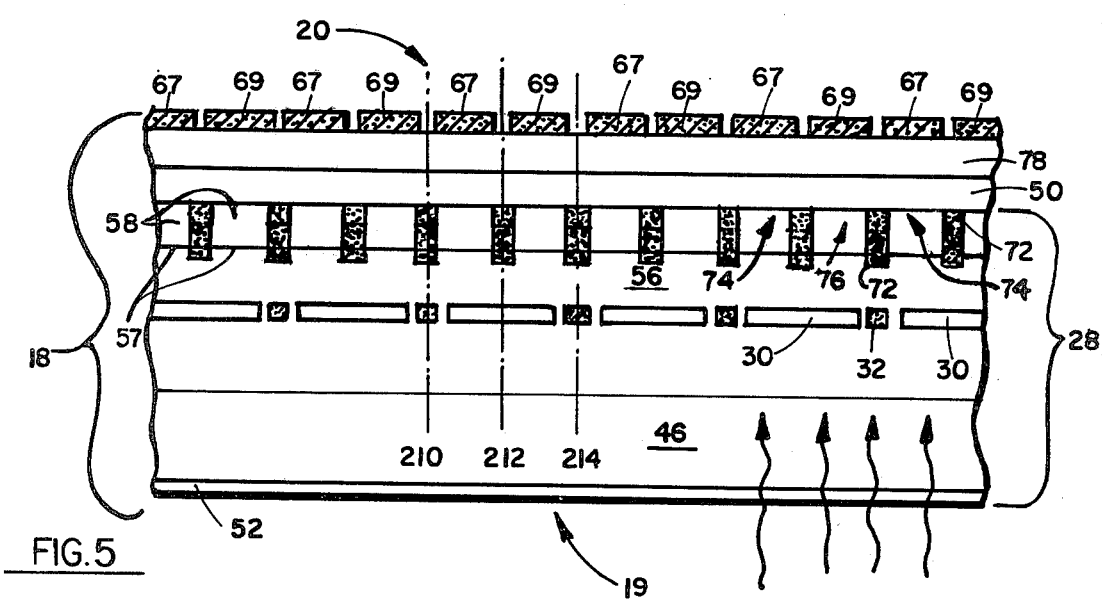
FIG. 5 is a simplified cross-section through the device of FIG. 2 taken along the line 5—5.

With reference to FIG. 5, incident energy 90, which may preferably be in the form of electromagnetic radiation constituting an image to be sensed impinges on the back surface 19 of thin segment 28, penetrates the semiconductor material and is absorbed with the generation of hole-electron pairs. The carriers of one sign are attached to and collected in the charge collection regions 30 to provide image intensity information in the form of charge quantities stored in the vicinity of the individual charge collection elements (CCE). The collection of these carriers on the charge collection elements is allowed to continue for a period which may be referred to as the image integration time. Once the image integration period has expired, a frame of the incident image has been detected and a CCE-to-CTD transfer voltage is applied to the electrodes 67 (or to the electrodes 69) to transfer the charges representing the detected image to array CTD's for readout. This voltage is of a sign and magnitude which causes a plurality of depletion regions to extend down from the vicinity of the front surface 20 of host material 22 well into the buried charge collection elements 30. The carriers collected by each charge collection element (CCE) are attracted into a depletion region associated therewith and migrate toward the front surface of host material 22. The CCE-to-CTD transfer voltage is then reduced to a charge retention voltage which no longer attracts charges from the charge collection elements but which retains the charge transferred from each charge collection element in a separate CTD charge storage well associated with that element. Once the transfer voltage has been reduced to the storage voltage level, the charge collection elements 30 begin accumulating charge representing a second frame of the applied image. Thus, a new image integration time begins. At the expiration of the second image integration time, a second frame of the incident image has been detected and a CCE-to-CTD transfer voltage is applied to the electrodes 69 (or 67) to transfer the charges representing the second detected image frame to the array CTD's which are not utilized for storing the charges from the first image frame. The CCE-to-CTD transfer voltage on electrodes 69 is then reduced to a charge storage voltage. Each charge collection element has associated therewith two CTD storage cells, one under an electrode 67 and one under an electrode 69. The associated CTD storage cells are the ones to which that charge collection element can transfer charge directly. Since each of these cells is in a different CTD, the CTD's they are in may also be referred to as associated CTD's. Charges representing the first frame of the image are now held in CTD storage wells under electrodes 67 and charges representing the second frame of the image are held in CTD charge storage wells under the electrodes 69. Since electrodes 67 and 69 both have charge storage voltages applied thereto, they are now at the same potential.

Referring now to FIG. 1, charge propagation voltages are applied to the charge transfer electrodes of set 60 (with the electrodes 67 and 69 having the same voltage applied to them) to transfer the charges representing the first and second frames to the output of the device.

The charges representing the two image frames are transferred to the output system on a row by row basis. The output system of the preferred embodiment incorporates (see FIG. 6) parallel output CTD's 104 and 106, along with control structures for transferring first frame charges to a first of those output CTD's and second frame charges to a second of those output CTD's. After each row of charges is transferred to the output CTD's, that row of charges is transferred through the output CTD's to the device output region 140 of the device wherein externally utilizable signals are generated.

Figure 3:
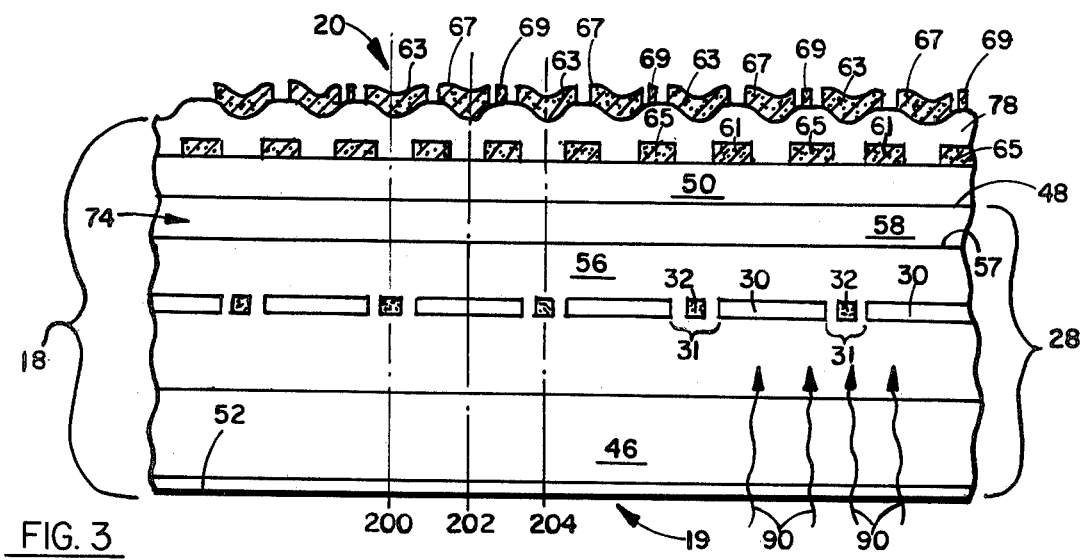
FIG. 3 is a simplified cross-section through the device of FIG. 2 taken along the line 3—3.

The structure of sensor device 18 is now discussed in more detail. Initially with reference to FIG. 1, sensor device 18 has a lower or back surface 19 and an upper or front surface 20 and comprises a wafer of host material 22 which, in this preferred embodiment, is n-type silicon. In addition to host semiconductor 22, device 18 includes auxiliary layers, members and structures. Wafer 22 is illustrated as having a thick segment 24, a thin segment 28 and a tapered transition segment 26 in the region between thick segment 24 and thin segment 28. Referring now to FIG. 3 for increased clarity, thin segment 28 includes the material which is active in converting the incident energy to electric charge which is representative of the impingent image. Where the impingent image is in the form of electromagnetic radiation the active material is usually electro-optically active and in this preferred embodiment is a semiconductor and silicon in particular. Buried charge collection elements or structures 30 are disposed within thin segment 28 in a preferably rectangular planar array with the plane of the array parallel to the front surface 20 of wafer 22. Each charge collection element collects photogenerated charge associated with the portion of the impingent image which is incident on segment 28 in the vicinity of that charge collection element. The charge collection elements may preferably be buried diode layers (doped p-type if segment 28 is doped n-type). The individual charge collection elements 30 are separated from each other by intervening isolating wafer portions 31 of segment 28 which are adapted to isolate each charge collection element (CCE) from adjacent charge collection elements and charges collected thereby. Wafer portions 31 preferably include isolation regions 32 which may preferably be regions of relatively heavy conductivity-type doping of the same conductivity type as segment 28 (i.e., n+ type there). This heavy doping prevents regions 32 from being depleted of charge carriers in response to the CCE-to-CTD transfer voltages to be applied to the device during its operation. This minimizes picture element (pixel) to picture element crosstalk or smearing.

Wafer 22 is preferably rectangular with the thick segment 24 extending entirely around the outside of the wafer to lend structural integrity to the device. The thickness of the thin segment 28 must be selected in accordance with the depth to which the radiation of interest will penetrate the semiconductor material before being photoresponsively absorbed. This depth of penetration depends on both the wave length of the radiation and the characteristics of the semiconductor material. The thickness of segment 28 must be selected in part to enable the buried charge collection elements 30 to be placed at a depth where (1) they can communicate in a controlled manner with the CTD's 70 of the array on the front side of the wafer and (2) still be close enough to that portion of the region 28 where the actinic radiation generates carriers so that cross diffusion of carriers from one picture element (pixel) to another prior to being collected by a charge collection element 30 can be restricted to an acceptably low level.

In order to minimize pixel to pixel smear due to charge carrier diffusion prior to collection, it is preferred to have the majority of carriers generated within a distance from the charge collection element in alignment therewith which is $\frac{1}{8}$ to $\frac{1}{2}$ the width of a charge collection element. (The width of a charge collection element is from the center of the adjacent region 32 on one side of the region 30 to the center of the adjacent region 32 on the other side of the diode. This $\frac{1}{8}$ to $\frac{1}{2}$ distance-to-width ratio assures that a minimal amount of pixel to pixel smear will occur. Electromagnetic radiation of many wavelengths, including visible light, penetrate silicon only very slightly. Consequently, in order for good resolution to be obtained with minimal pixel-to-pixel smear, the silicon of portion 28 must be very thin, 10–25 μm. Silicon wafers of uniform thickness as thin as 10–25 μm are very fragile and difficult to handle and process without experiencing unacceptably high breakage rates. Consequently, if a very thin segment 28 is needed, it is preferred to start with a wafer having a thickness which is sufficient to provide structural integrity and retain that thickness for segment 24 and etch away or otherwise remove material toward the center of the wafer to form a thin segment 28 of the desired thickness.

The part 46 of thin segment 28 near the back surface 19 is preferably provided with a graded doping concentration profile (more heavily doped n-type at the surface in the preferred embodiment) which creates a built-in electric field which will drive charge carriers of one sign toward the charge collection regions 30. This built-in electric field causes the carriers (holes) it is desired to collect to drift in the electric field toward the charge collection structures and away from the back surface 19 which usually exhibits a higher recombination velocity than the interior of the semiconductor material. The built-in electric field, by driving the desired carrier (holes) away from the back surface, reduces the number of those carriers which reach the back surface, thereby minimizing the number which recombine at that surface and helping to maximize the collection efficiency of the device. The relative depth of region 46 is a matter of design choice.

An appropriate passivation dielectric 52 which is substantially transparent and preferably substantially non-reflecting and non-diffusing to the radiation constituting the impingent image-to-be-sensed is provided on the surface 19 of the thinned segment 28 of the semiconductor wafer. Passivation layer 52 permits substantially all of the useful image radiation to be absorbed in the semiconductor while preventing or minimizing environmentally induced deterioration of the semiconductor material and the decrease in the sensitivity of the array which would accompany such semiconductor deterioration.

The portion 58 of the wafer adjacent the front surface of wafer 22 is preferably doped fairly heavily p-type in order that the set 70 of charge transfer devices (CTD's) having buried channels may be formulated there which are capable of storing and transporting the charges collected by the buried diodes. Portion 58 is of the opposite conductivity type from region 56 within which buried diodes 30 are formed. Region 58 forms a pn-junction 57 with the portion 56. Structurally (see FIGS. 2 and 5) the CTD's of set 70 include channel stop regions 72 which extend through region 58 of segment 28 into region 56, a charge transfer device dielectric 50 such as thermally grown silicon dioxide on the front surface of the wafer 22 and a set 60 of charge transfer device control electrodes on the dielectric layer and oriented substantially perpendicular to channel stops 72. Charge transfer device electrode set 60 may preferably comprise a four-phase two-level set of electrodes. The first and third phase electrodes, 61 and 65 respectively, are lower level electrodes and are disposed directly on dielectric layer 50. The upper level second phase electrodes 63 and the fourth phase electrodes 67 and 69 are disposed on a dielectric layer 78 which overlies the first level electrodes 61 and 65. Each fourth phase electrode is comprised of an electrode 67 and an electrode 69 which may preferably be referred to as split fourth phase electrodes. Electrodes 67 and 69 resemble two combs having alternate teeth missing and placed teeth-to-teeth with the teeth of one comb aligned with the missing teeth of the other comb and interdigitated therewith. The details of this structure will be made clearer subsequently from FIGS. 3–5 and the discussion thereof. The electrodes 67 and 69 are made separate in order to accomodate the transfer of first frame and second frame charges from the buried charge collection elements to separate CTD's. For CTD charge propagation, electrodes 67 and 69 are driven with the same potential in order that they will act as a single electrode in controlling the transfer of charge thereunder. It will be recognized that the designation of a specific electrode as the first phase is essentially arbitrary except as it relates to the device structure at the ends of the CTD's.

The location of the device output structure is illustrated in FIG. 1 by the dashed rectangle 100 disposed along the right-hand portion of front surface 20 of sensor device 18. Output structure 100 receives charges from the charge transfer devices 70 and serves to transfer image information from the charge transfer devices 70 to external utilization circuitry. For clarity and simplicity, FIG. 1 illustrates only the position of the output structure. The details of the output structure 100 are illustrated in FIGS. 6–10 and discussed hereinafter. The position of an optional electronic input structure 98 is illustrated at the left hand side of front surface 20 of the sensor device 18. Input structure 98 may be utilized to provide input charges to the charge transfer channels 74 and 76, if desired.

Figure 2:
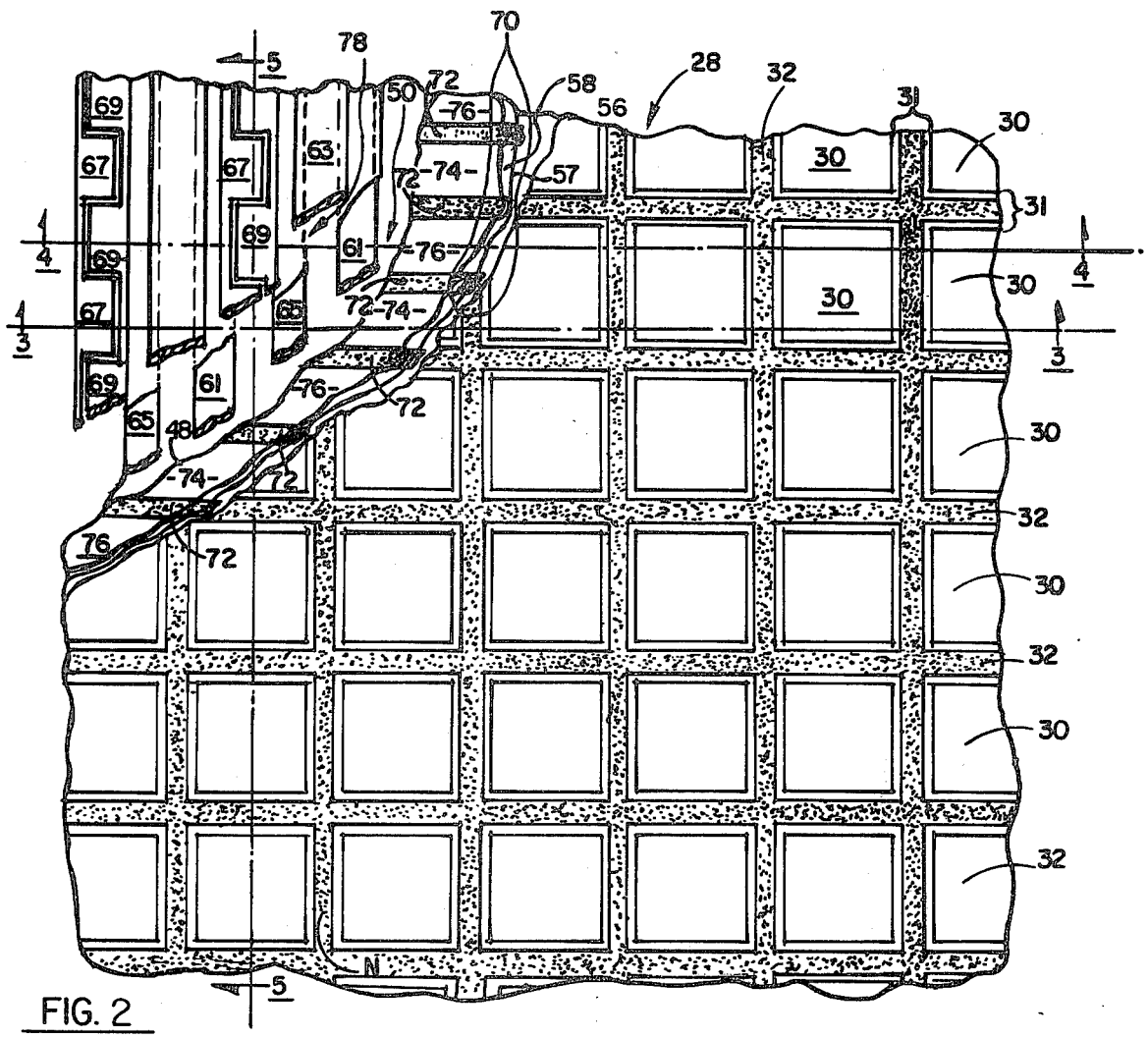
FIG. 2 is a simplified partially cut-away plan view of a portion of the front side of an image sensing array in accordance with the invention.

FIG. 2 is a plan view of the device of FIG. 1 looking down on the front surface 20. In this view, the material between the buried charge collection elements 30 and the observer has been removed from much of the figure in order to illustrate the array pattern in which the charge collection diodes 30 are arranged and the manner in which they are horizontally isolated from each other by the intervening wafer portions 31 of segment 28 and charge collector isolation region 32. In the upper left hand corner of the figure the material between the buried charge collection diodes 30 and the observer is shown in a cut-away form. The portion 56 of the wafer 22 separating buried diodes 30 from the dielectric layer 50 is the first material overlying buried diodes 30. The more heavily doped opposite conductivity type front surface region 58 of host material 22 extends from pn junction 57 with region 56 to the interface 48 between host 22 and dielectric layer 50. A plurality of spaced apart substantially parallel charge transfer channel stops 72 divide regions 58 along the front surface of the semiconductor wafer 22 into a plurality of parallel charge transfer device channel regions 74 and 76 which constitute the transfer channels of the charge transfer devices of set 70. Channel stops 72 preferably comprise heavily doped (n-type in this embodiment) semiconductor regions disposed along the front surface of segment 28 directly subjacent dielectric layer 50 and extending into region 56. The charge transfer control electrodes of set 60 are preferably fabricated so that propagation of charge in charge transfer channels 74 and 76 may take place either left to right or right to left in FIG. 2, i.e. the electrodes induce symmetrical potentials thereunder. In this preferred embodiment the charge transfer channels 76 and 76 are preferably buried charge transfer channels in which the charge storage (transport) regions of the channels are buried at a depth which is sufficient to minimize or eliminate the adverse effect of surface traps on charge transfer efficiency within the charge transfer channels. The charge transfer device control electrodes 60 overlie dielectric layer 50. The first level electrodes 61 and 65 are disposed directly on dielectric layer 50. A dielectric layer 78 overlies the first level electrodes 61 and 65. The second level electrodes 67, 69 and 63 are disposed on top of dielectric layer 78. Electrodes 67 constitute the fourth phase electrodes for charge transfer device channels 74 while the electrodes 69 constitute the fourth phase electrode for the intervening charge transfer channels 76.

Figure 4:
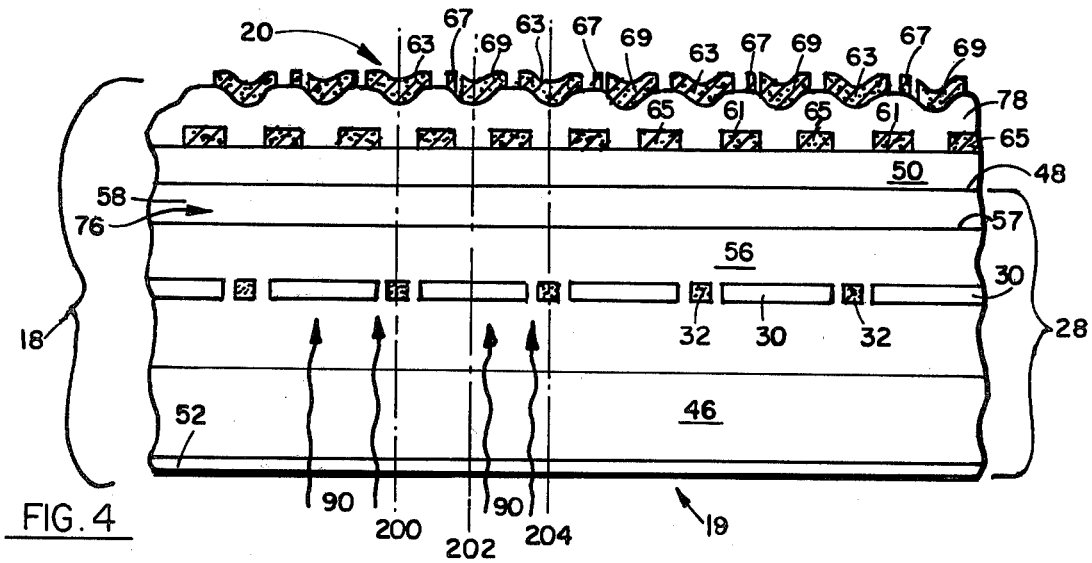
FIG. 4 is a simplified cross-section through the device of FIG. 2 taken along the line 4—4.

The relationship between the charge transfer device control electrodes and the buried diodes will be more clearly understood from reference to FIGS. 3–5. FIG. 3 is a cross-section taken through the device of FIG. 2 along the line 3—3 looking in the direction indicated by the arrows. The portion of the thinned segment 28 of the wafer 22 which is illustrated in FIG. 3 is of limited lateral extent and therefore contains just a few of the buried charge collection elements 30. Charge collection elements 30 are positioned within the thickness of region 28 in a plane which is parallel to the interface 48. A distance of about 6 um separates charge collection elements 30 from pn junction 57. P-n junction 57 constitutes the interface between semiconductor regions 56 and 58. The front surface of the region 58 constitutes interface 48 between the host material 22 and dielectric layer 50 which is disposed thereon. The first level charge transfer device electrodes 61 and 65 are disposed on dielectric layer 50. Dielectric layer 78 overlies the first layer electrodes 61 and 65 and insulates them from the second layer electrodes 63, 67 and 69 which are disposed on dielectric layer 78 in alignment with the spaces between the first layer electrodes. As will be noted from the position of the section line 3—3 in FIG. 2, the plane of this section is parallel to the length of and within one of the charge transfer device channels 74 (which have electrodes 67 as their fourth-phase electrodes). Wide portions (teeth) of electrodes 67 overlie the spaces between electrodes 65 and 61 in the fourth-phase positions. Narrow portions (missing teeth) of the electrodes 69 overlie the underlying electrodes 65 whereby in the channels 74 electrodes 67 constitute the fourth-phase electrodes. The electrodes 69 have a minimal effect on the potential within the charge transfer channels 74 because they are shielded therefrom by the intervening electrodes 65.

FIG. 4 illustrates the relationship between an electrode 69 and an underlying charge transfer channel 76 and is a section taken through the device of FIG. 2 along the line 4—4 looking in the direction of the arrows. FIG. 4 is substantially identical to FIG. 3, with the exception that wide portions (teeth) of the electrodes 69 overlie the spaces between electrode 65 and 61 in the fourth-phase position and narrow portions (missing teeth) of the electrodes 67 overlie the underlying electrodes 61. In a manner similar to that described above with respect to FIG. 3 the electrodes 69 constitute the fourth-phase electrode for the underlying charge transfer device channels 76 and those channels are shielded from the potential of the electrodes 67 by the intervening electrodes 61.

FIG. 5 is a cross-section through the device of FIG. 2 taken along the line 5—5 looking in the direction of the arrows. The portion of thinned section 28 shown in this view is of limited lateral extent and therefore contains only a few of the charge transfer channel stop regions 72, and the buried charge collection structures 30. The charge transfer channel stops 72 are disposed perpendicular to the surface of the paper and the longitudinal dimension of the electrodes is parallel to the surface of the paper. Charge transport in the channels 74 and 76 is into or out of the paper parallel to the orientation of the channel stops. It will be noted from FIG. 2 that the section line 5—5 runs perpendicular to the direction of propagation in the charge transfer channels and through electrodes 67 and 69 over the space between the underlying electrodes 65 and 61. Consequently, in the section view the individual wide portions of the sectioned electrode 67 appear to be unconnected and separated by individual wide portions of the sectioned electrode 69 which also appear to be unconnected. However, as will be clear from FIG. 2 the illustrated individual portions of the sectioned electrode 67 are interconnected by portions of the sectioned electrode 67 which are out of the plane of the section. The individual portions of the sectioned electrode 69 are similarly interconnected by portions of the sectioned electrode 69 which are out of the plane of the section. The spaces between the individual portions of electrodes 67 and 69 all occur directly over channel stops 72 and each wide segment of an electrode 67 or 69 spans the entire width of the underlying charge transfer channel 74 or 76, respectively, or spans at least enough of it to control the potential therein. Thus, within a channel 74, propagation is controlled by a four-phase set of propagation electrodes comprising electrodes 61, 63, 65 and 67. Within a charge transfer channel 76, propagation is controlled by a four-phase electrode set comprising electrodes 61, 63, 65 and 69. For propagation of charge within the charge transfer channels the same potential is preferably applied to the electrodes 67 and 68 with the result that propagation occurs in a parallel manner in all of the charge transfer channels 74 and 76.

It is preferred that the buried diodes 30 be rectangular and have one pair of opposing sides parallel to the direction of propagation in the charge transfer channels of set 70 and have the other pair of opposing sides perpendicular to that direction. Reference lines 200, 202, and 204 in FIGS. 3 and 4 and 210, 212 and 214 in FIG. 5 are provided to illustrate the preferred position of the buried diodes with respect to the overlying charge propagation control electrodes of the set 60 and charge propagation channels 74 and 76. With respect to movement parallel to the direction of propagation in the overlying channels, it is preferred to have the center of diode 30 directly under the effective center of the overlying propagation electrode 67 or 69, (reference line 202, FIGS. 3 and 4). It is also preferred to have isolation region 32 centered under electrodes 63 (reference lines 200, 204; FIGS. 3 and 4). With respect to movement in a direction perpendicular to the direction of propagation in the overlying charge transfer channels, it is preferred to have the center of a buried diode 30 directly under the center of an overlying channel stop 72 (which in turn is directly under the space between interdigitated teeth of electrodes 67 and 69) (reference line 212, FIG. 5). It is also preferred to have the center of the isolation region 32 on either side of the buried diode centered under the next nearest channel stop regions 72. In this manner, the buried diode 30 is geometrically as centered as possible with respect to the electrodes 67 and 69 of the overlying charge transfer channels 74 and 76. More particularly, this geometrically symmetric relationship between each buried diode and the overlying electrodes 67 and 69 renders the buried-diode-to-overlying-charge-transfer-device charge transfer characteristics as identical as possible. Identical charge transfer characteristics are important when first frame charge is transferred to the areas under one of electrodes 67 and 69 and second frame charge is transferred to the areas under the other. With identical transfer characteristics, equal transfer times provide equal transfer for equal initial charge independent of whether the transfer is to the area under electrode 67 or electrode 69. When the diode read conditions are such that complete charge transfer from the diodes to the charge transfer devices does not take place, that effect will be substantially the same for transfers to a charge transfer device channel 74 and to a charge transfer device channel 76.

The illustrated structure allows the charge representing a first frame of an image of a scene to be sensed to be transferred to charge transfer channels 74 and then held in the areas underlying electrodes 67 while the charges representing a second frame of the image are collected in the buried diodes. This second set of charges may then be transferred to overlying channels 76 and held under electrodes 69. The charges forming the two frames of the image may then be transferred out along the respective channels 74 and 76 in parallel.

In order to maximize the isolation between adjacent buried diodes and thereby provide as sharp an image as possible, the region of the semiconductor wafer between adjacent diodes is preferably heavily doped n-type. This minimizes crossread of collected charge from one buried diode to a CTD cell associated with a different diode.

Presently achievable CTD's have charge transfer efficiencies of slightly less than 1. This means that when a packet of charge in a CTD storage well has been transferred forward by one full cycle, there is a finite probability that some charge which was part of that packet has been left behind. Any charge which has been left behind can add to the charge in the packet in the succeeding CTD storage cell. This tends to smear charge from a given storage cell into the succeeding cell(s).

To obtain maximum accuracy in discerning changes in a scene between a first image and a second image, crosstalk between frames must be minimized because crosstalk between frames obscures frame to frame changes. Any such interframe smear of first frame charge and second frame charge interferes with accurate scene change determination by converting first frame charge to second frame charge and vice versa. This makes the quantity of charge in a given charge packet dependent on more than just the intensity of the corresponding picture element during the corresponding frame's integration time.

Smearing of first frame or second frame charges within the same frame (intraframe crosstalk) does not change the quantity of charge in a frame, and affects the first and second frames in the same way. Smearing of charge collected by a given charge collection element with charges from the same frame collected by an adjacent charge collection element can detract from the sharpness of an image. However, intraframe smear has a minimal tendency toward obscuring image changes and thus has a much smaller detrimental affect on moving target or image change discernment than interframe crosstalk does.

If, in the present device, alternate cells of a single CTD were utilized to store first and second frame charges, then any charge-transfer-in-efficiency-induced charge smear would constitute interframe crosstalk and degrade the image change discernment ability of the system. However, since each CTD contains charges from only one frame, any charge transfer-inefficiency-induced charge smear constitutes intraframe smear which has a lesser tendency to degrade change discernment abilities. Thus this preferred embodiment minimizes crosstalk between first and second frames during transfer of the charges representing the sensed images by transferring first frame charges which were collected by charge collection elements of a given column in a first CTD and second frame charges from the same column in a second parallel CTD. The present invention makes this possible by its provision of split fourth phase electrodes 67,69 which enable first frame charges to be transferred to first CTD's (74) and second frame charges to be transferred to second CTD's (76).

In order to transfer the information contained in channels 74 and 76 to external circuitry, individual electrical output devices with external leads could be fabricated at the end of each of the channels 74 and 76. However, such an arrangement has several disadvantages. First, this results in an excessive number of output devices and output leads being utilized for even a moderate size having only 100 charge transfer channels in the array. In a version where two charge transfer device channels are associated with each charge collection element, an array having 100 charge transfer channels has only 50 charge collection elements along the array direction which is perpendicular to the length of the CTD channels, although the number in the direction parallel to the CTD channels is not directly limited. Consequently, with the exception of image sensors which are designed to sense a limited, predetermined set of possible images, such as alphanumeric characters, most image sensors require a large enough number of pixels along two perpendicular directions of the image field that individual electrical output devices for each array CTD channel becomes numerically prohibitive because of the large number of individual leads required. Second, it is extremely difficult, if not impossible, to build separate output devices having identical transfer characteristics, particularly with sufficient yield to make economic sense. Consequently, individual electrical output devices would complicate the data reduction process because allowances would have to be made for and corrections made for differing gains in the various individual output devices. Alternatively, the charge could be transferred to a single output channel running perpendicular to the channels 74 and 76. However, adjacent storage cells in this charge transfer channel would contain the charges generated by picture elements of different frames. Thus, charge-transfer-inefficiency-induced charge smear would be interframe crosstalk. This is unacceptable for highest sensitivity systems. In accordance with the invention, crosstalk problems are minimized by transferring charge packets from the channels 74 to a first output CTD channel 104 and by transferring the charge packets from channels 76 to a second output CTD channel 106. The channels 104 and 106 are aligned substantially perpendicular to the channels 74 and 76. In this preferred embodiment, transfer to two separate output channels is accomplished by transferring channel 74 charges through (across) CTD channel 106 while retaining channel 76 charges in channel 106.

The output structure for the preferred embodiment is illustrated in plan view in FIG. 6. For clarity, the charge transfer device control electrodes 60 have been omitted from FIG. 6, but their positions can be seen by referring to any one of FIGS. 7-10. The output structure 100 comprises a pair of charge transfer device channels 104 and 106 which are preferably oriented substantially perpendicular to charge transfer channels 74 and 76. Propagation within channels 104 and 106 is controlled by a set 120 of transfer control electrodes. Set 120 is comprised of a plurality of electrodes which comprise a four-phase propagation system. Each of the electrodes of a given phase is identified by the same reference number. Thus, the set 120 comprises pluralities of electrodes 122, 124, 126 and 128. Transport of charge into the output charge transfer channels 104 and 106 from array channels 74 and 76 is controlled by transfer gate electrodes 110 and 112 and a plurality of channel stop regions 116. Channels 104 and 106 are separated from each other by the plurality of channel stop regions 116 and transfer gate electrode 112 which is aligned parallel to the length of channels 104 and 106. Transfer gate electrode 112 underlies the propagation control electrodes 120, in order that it may control the potential in the area between channels 104 and 106. Channel 104 is bounded on the side away from channel 106 by a channel stop region 114.

Each of the electrodes 122, 124, 126 and 128 is offset over channel 104 relative to its position over channel 106. This is achieved by patterning the portions of these electrodes which overlie the region between channels 104 and 106 to lie at an angle to those channels.

An output region 140 at the lower end of output channels 104 and 106 communicates with both of these channels and converts charges received from the channels to externally utilizable signals. Output region 140 is configured to receive charges from channels 104 and 106 in an alternating manner. Thus, output region 140 operates as a simple 2 to 1 multiplexer.

Two input regions 154 and 156 may optionally be provided at the upper ends of channels 104 and 106, respectively. Alternatively, a single input region 150 similar to output region 140 may be provided. Input regions 154 and 156 (or 150) may be utilized to introduce charges into output CTD's 104 and 106 respectively for transfer to the CTD's 74 and 76 of the array.

During readout, the selective transfer of information from channel 106 to channel 104 is accomplished utilizing the structure of channel stop regions 116, transfer electrode 112 and the offsetting of the electrodes of transfer control set 120 between channels 106 and 104. The manner in which this allows the selective transfer of the charge packets received from channels 74 to channel 104 will be explained subsequently during the discussion of the operation of the output structure. The details of the output structure will be more clearly understood by reference to FIGS. 7, 8, 9 and 10 which are cross-sections taken through the structure of FIG. 6 along the lines 7—7, 8—8, 9—9 and 10—10, respectively.

Figure 7:
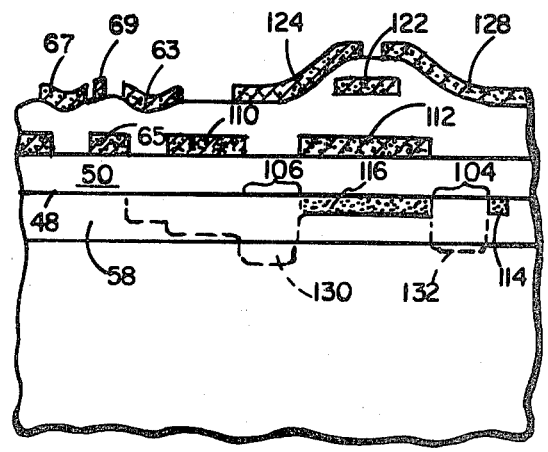
FIG. 7 is a simplified cross-section through the structure of FIG. 6 taken along the line 7—7.
Figure 8:
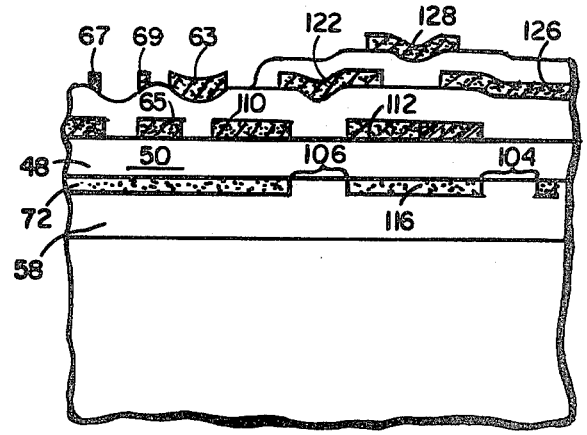
FIG. 8 is a simplified cross-section through the structure of FIG. 6 taken along the line 8—8.

In the interest of clarity, it is pointed out that in FIG. 7 the electrode 122 despite its possible appearance does not run parallel to electrode 112 and is not floating, but rather the section line 7—7 crosses entirely through the diagonal portion of electrode 122 which overlies the channel stop region 116. The situation is similar with respect to electrode 126 in FIG. 9, with the exception that the diagonally cut electrode 126 does not overlie a channel stop region at the plane of the section 9—9. In FIG. 8, electrodes 67 and 69 appear to each be narrow electrodes which are widely spaced from each other. This is because the plane of the section passes through a channel stop in an area between a wide portion of electrode 67 and a wide portion of electrode 69 where, in order to prevent a short between them, both electrodes are narrow. That is, section line 8—8 of FIG. 6 would, if extended, intersect a line like line 210 of FIG. 5. It is believed that in other respects the structure of FIGS. 7-10 will be well understood from reference to FIG. 6 and the discussion thereof.

Input means 98 may comprise individual input devices for each of the charge transfer channels of the array. However, it is preferred that input means 98 be either a single CTD running perpendicular to the array CTD's or a structure similar to output means 100. In either event, data is inserted serially into the input means one row at a time for transfer into the CTD's of the array in parallel form (in a well known manner corresponding to the serial-parallel portion of serial parallel-serial propagation.

OPERATION

An image of a scene-to-be-sensed is focused on back surface 19 of a thinned segment 28 of the semiconductor wafer 22. This image preferably comprises energy to which the semiconductor material responds by the generation of hole-electron pairs and is preferably in the form of electromagnetic radiation of a wave-length which is directly absorbable by the semiconductor material with an attendant generation of one or more hole-electron pairs. However, techniques such as providing an image sensitive overlayer which injects carriers into the semiconductor may be utilized so long as the layer provides carriers which can be collected by the buried charge collection regions and so long as those carriers are present in each pixel in numbers determined by the intensity of the incident image on that pixel. Other charge production techniques may also be utilized so long as they meet these number and collectability criterion. When a hole-electron pair is generated upon the absorption of a photon within the region between the buried diodes 30 and the back surface 19 of segment 28, the hole of the pair is attracted to the nearest buried diode 30 by the electric field created by that diode and the graded doping of the portion of the semiconductor material 46 between the buried diode 30 and the back surface 19 of the wafer. If the carrier is generated between the buried diode and the front surface of host material 22, it may be collected by the buried diode or by the CTD thereover, depending on the position where it was generated, the way in which it diffuses and the bias voltages applied to the CTD. It is because of this uncertainty of collection that it is considered preferable to fabricate the device in a manner which avoids the generation of carriers in the region where they can be collected directly by the CTD. If such direct collection cannot be avoided, the data reduction process must take account of the charges which are directly collected by the CTD. If potentials which prevent charge storage are applied to the CTD's during the first image integration time, no charge will be collected directly by the CTD. However, during the second image integration time a storage voltage must be applied to the locations storing first frame charge and these locations may directly collect some charge during that time thereby increasing the charge they store. This introduces charge in the first frame packets which causes an apparent increase in first frame intensity. The unbalancing effect of charge directly collected by the CTD can be reduced by applying storage potentials to the frame storage locations of the CTD's (i.e. electrodes 67 and 69) during both image integration times. In this way both storage locations collect direct charge during both integration times and any differences in the amounts will usually be second order effects on the total differences in charge. If we call the charge collected by a given buried collection region $C_{B1}$ for the first frame and $C_{B2}$ for the second frame, the charge directly collected during the first frame by the associated first frame storage area $C^1_{D1}$ and by the associated second frame storage area $C^2_{D1}$ and the charge directly collected during the second frame by that first frame storage area $C^1_{D2}$ and by that second frame storage area $C^2_{D2}$, then after the transfer of the charge $C_{B2}$ to the second frame storage area the total charge stored in the first and second frame areas ($C^1_T$ and $C^2_T$ respectively) can be expressed as:

$$C^1_T = C_{B1} + C^1_{D1} + C^1_{D2}$$

and $$C^2_T = C_{B2} + C^2_{D1} + C^2_{D2}$$

If it is assumed that the image intensity is uniform across the entire buried collection region (pixel) then the charge collected directly ($C^1_{D1}$ and $C^2_{D1}$) by the storage locations for that pixel will be the same during the first integration time. During the second integration time the two storage locations will directly collect equal amounts of charge except for higher order effects on charge collection which result from the larger charge stored in the first frame storage cell which then contains $C_{B1}$ as well as $C^1_{D1}$.

Making the simplifying assumption that the image intensity is uniform across the pixel, yields: $C^1_{D1} = C^2_{D1}$. Further if second order differences in $C^1_{D2}$ and $C^2_{D2}$ are ignored, then $C^1_{D2} = C^2_{D2}$ and $$C_T^1 - C_T^2 = C_{B1} - C_{B2}$$

as is desired. In the event the simplifying assumptions are not valid, then the perturbing effect of direct charge collection by the CTD's depends on the amount of charge collected thereby as compared to the amount collected by the charge collection elements (CCE's) 30 and the degree to which the directly collected charge quantities are different. Thus, fabrication of the device in a manner which causes most of the carriers to be generated between the back surface 19 and the CCE's minimizes any perturbing effect of direct charge collection by minimizing direct charge collection.

The photo-generated charge is allowed to collect on the buried charge collection elements (CCE) (diodes) 30 for a period of time which is determined in accordance with the expected intensity of the image to be sensed. This period of time may be referred to as a first charge integration time. Once the first charge integration time has expired, isolation voltages are applied to electrodes 61 and 65, if they have not already been applied to prevent direct CTD charge collection. A CCE-to-CTD transfer voltage is then applied to all of the electrodes 67. These voltages may be collectively referred to as a charge collection element read voltage set. The magnitude and duration of the CCE-to-CTD transfer voltage will depend on the thickness of the dielectric layers 50 and 78, the device doping levels, the depth at which the diodes 30 are buried below the interface 48 and the charge capacity of the diode. To obtain a fast, complete transfer of the collected charge from the diodes 30 to the charge transfer device channels 74, the CCE-to-CTD transfer voltage should be sufficient to extend the depletion region under each electrode 67 well into the diode region until the end of the read time. The collected charge will transfer from the buried diode to the charge transfer device's potential well which is created by the applied CCE-to-CTD transfer voltage. The isolation voltages applied to electrodes 61 and 65 prevent the charge packet from spreading laterally. The CCE-to-CTD transfer voltage on electrodes 67 is then reduced to a charge holding level which retains the collected packet of charge under the electrode 67. The isolation voltages are retained on electrodes 61 and 65 to prevent the charge packets from spreading and mingling. Since the diode read set of voltages is applied to all the electrodes 61, 63 and 67 simultaneously, the charge on each buried charge collection structure is transferred into an associated storage well of a channel 74 at the same time. The charges held in the storage wells of the charge transfer devices 74 under electrodes 67 constitute a first or initial image frame of the scene to be sensed, as it was during the first integration time. A new charge collection integration period begins when the CCE-to-CTD transfer voltage is reduced to a charge storage level. At the end of this second charge integration time, a CCE-to-CTD transfer voltage is applied to electrodes 69 while the isolation voltages are maintained on electrodes 61 and 65 and the storage voltage is maintained on electrodes 67. This causes the charge collected in each diode during the second charge integration time to transfer to a potential well under the electrode 69 in the underlying charge transfer channel 76. The CCE-to-CTD transfer voltage is then reduced to a charge storage voltage. The charges held in the storage wells of charge transfer devices 76 under electrodes 69 constitute a second image frame of the scene to be sensed, as it was during the second integration time.

Provided that the device has been properly constructed, the charge transfer characteristics are substantially identical from each of the buried diodes to the individual associated storage cells of each of the associated charge transfer devices. This is especially true when a CCE-to-CTD transfer voltage magnitude and duration is utilized which assures complete depletion of the charge collection elements during the read cycle. Consequently, if the first and second charge integration times are identical, any difference in the charge stored in the CTD potential wells in CTD's 74 and 76 over a given buried charge collection element must be a result of a difference in the intensity of the actinic energy impinging in the vicinity of that element during the first and second charge integration times (assuming that direct collection by the CTD is avoided or is negligible). For clarity in the following description of the preferred embodiment, a column of charge collection elements in the preferred embodiment is defined as those elements which are under a given CTD channel and a row of charge collection elements in the preferred embodiment is defined as being perpendicular to a column of elements. A row of CTD storage cells is defined as those storage cells over a row of elements. The row of diodes nearest the output system is referred to as the first row.

When charge transfer device propagation voltages are applied to the four-phase set of electrodes 61, 63, 65 and (67, 69), the same potential is applied to both electrodes 67 and 69 in order that propagation may take place in a parallel manner in the adjacent channels 74 and 76. If no CTD storage cells intervene between the first row CTD cells and the output system, then during a first cycle of the CTD propagation voltages, the charges contained in the first row of CTD storage cells are transferred to the CTD's of output means 100 and each other row moves forward one cycle along the CTD's of set 70. After the packets of charge thus placed in the output CTD's have been processed through the electrical output region 140, the row of charge packets which were originally received by the charge transfer devices from the buried diodes in the second row are transported to the CTD's of output means 100 and the other rows are moved forward one cycle. Each time the rows of charge packets in the array CTD's are transferred forward one CTD cycle, a row of empty CTD storage cells originates at the back end of the CTD's unless charge input circuitry 98 has been provided at that end of the CTD's and has charge input inducing conditions impressed on it. The forward propagation in channels 74 and 76 may be a continuous process if the propagation signals applied to the array transfer electrode set 60 and the propagation signals applied to the output transfer electrode set 120 are properly related in frequency, phase and amplitude. However, the propagation in channels 74 and 76 may be done on a start and stop basis. This occurs when after a row of charge packets has been transferred to the CTD's of output means 100 of the preferred embodiment, the propagation of charge within the charge transfer devices 70 of the array is temporarily halted until charge packets which were transferred to the CTD's of output means 100 have been transferred through the electrical output region 140 of output means 100.

The operation of the output circuitry will be explained with reference to FIGS. 6–10. A row of charge packets exists or will be transferred into the portion of each of the charge transfer channels 74 and 76 which underlies the electrode 63 shown in FIG. 7. This charge can be held there for a desired period of time by holding fixed the propagation voltages applied to the charge transfer control electrodes of set 60. The charge in the packets in the first row of storage cells of the charge transfer devices 70 are transferred to output charge transfer channels 104 and 106 as an initial step in transferring them to external circuitry for utilization. In preparation for transferring the charge packets in the first row of storage cells to the charge transfer channels 104 and 106, pocket inducing voltages are applied to electrodes 124 and 128 and isolation voltages are applied to the electrodes 122 and 126. This induces isolated charge storage pockets in channels 104 and 106 under each electrode 124 and 128. In channel 106 the pockets underlying electrodes 124 are in alignment with channel 76 and the pockets underlying electrodes 128 are in alignment with channels 74. In channel 104 the pockets underlying electrodes 124 are in alignment with channels 74 and the pockets underlying electrodes 128 are in alignment with channels 76. This change in alignment is a result of the angling of the portions of the electrodes 124 and 128 which lie between channels 104 and 106. The transfer of charge from the first row of storage cells of the charge transfer device array 70 (those underlying electrode 63 in FIG. 7) to channels 104 and 106 may be accomplished either as a one step or a two step process. A one step process will be described first. Thereafter, a two step process will be described briefly.

Figure 9:
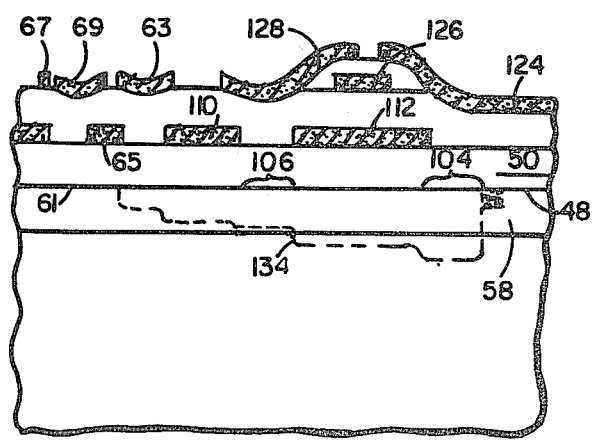
FIG. 9 is a simplified cross-section through the structure of FIG. 6 taken along the line 9—9.
Figure 10:
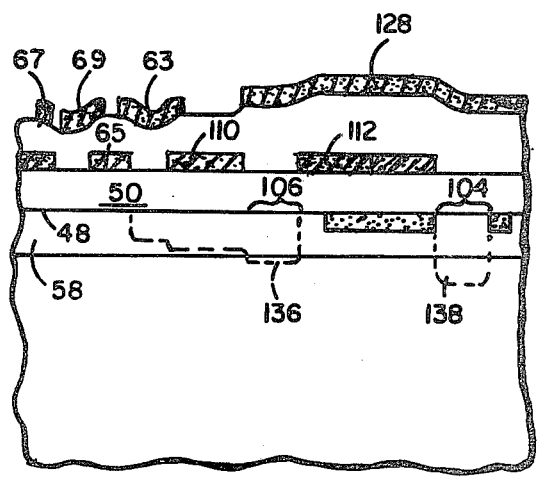
FIG. 10 is a simplified cross-section through the structure of FIG. 6 taken along the line 10—10.

The pocket inducing voltages applied to electrodes 128 are sufficient to create potential wells (pockets) thereunder which are capable, within either channel 106 or 104, of holding the entire charge packet contained in any one pocket in any of the channels 74 or 76. The voltages applied to electrodes 124 are sufficient to induce pockets thereunder which are enough deeper than the pockets induced under the electrodes 128 that the pockets under electrodes 124 are capable of holding the entire charge packet contained in any one pocket in any of the channels 74 and 76 at a deeper potential than the deepest potential in any pocket under an electrode 128. Consequently, if the charge from one pocket is transferred to a pocket under an electrode 128 which is connected to a pocket under an electrode 124, the entire packet will migrate to and be held in the pocket under the electrode 124. A pocket inducing voltage is applied to transfer electrode 112 to create a pocket thereunder which is as deep or a little deeper than the pocket induced in channel 106 by electrode 128 but shallower than the pocket induced in channel 104 by electrode 124 so that the pocket under electrode 124 can hold an entire packet at a deeper potential than that under electrode 112. Each of these pockets under electrode 112 is in alignment with channel 74 as is illustrated in FIG. 9. The output system is now ready to receive the first row of charge packets. The voltage applied to array-to-output-means transfer gate electrode 110 is established at a value which creates a pocket thereunder which is of a proper depth to cause each charge packet held in the first row of the CTD array 70 to transfer to the pocket of channel 106 aligned therewith. The above discussed voltages may be referred to as charge reception voltages for output structure 100 because they enable the structure 100 to receive charge from the CTD array 70.

The charge held in the initial row position of each channel 76 will migrate into the aligned pocket induced in channel 106 under electrodes 124. The packet will remain in that pocket until the applied voltages are changed. The general configuration of this potential well is illustrated by dashed line 130 in FIG. 7 which is a cross-section taken through output structure 100 in alignment with the center of a channel 76. The voltage applied to electrode 110 induces a potential well which is deeper than the well under electrode 63. The voltage applied to electrode 110 may be an a.c. or d.c. signal, but the preferred signal is pulsed d.c. The voltage applied to each of the electrodes 124 induces a charge attracting pocket thereunder within channel 106. The potential well induced under each electrode 124 is deeper than the one induced under electrode 110. In the region between channels 104 and 106 the voltage on electrode 124 is prevented from inducing a charge attracting pocket because transfer gate electrode 112 shields that material from the potential on electrode 124 and further because the channel stop regions 116 shield that material from the potentials on electrode 112. The charge attracted into channel 106 from channel 76 will not spread along the length of channel 106 for the reason that the electrodes 122 and 126 have voltages applied thereto which prevent the formation thereunder of potential wells which are sufficiently deep to allow the passage of the charge. The potential applied by the electrodes 122 and 126 in combination with the channel stop diffusions 72 of channels 74 and 76 and the channel stop region 116 of the output circuitry create a barrier which bounds the pockets under electrodes 124 in channel 106 in the forward, backward and one sidewards direction. This is illustrated in FIG. 8 which is a cross-section taken in alignment with an electrode 122 over the channel 106. A cross-section taken through a channel stop 72 in alignment with an electrode 126 overlying channel 106 would appear similar to the one in FIG. 8 with the exception that the electrodes 122, 128 and 126 would be replaced by electrodes 126, 124 and 122, respectively.

Each charge packet in the initial row of the channels 74 is attracted into a pocket in channel 106 underlying an electrode 128 in the same manner as has just been described for the packets in channels 76. However, unlike the just discussed situation the material aligned therewith under electrode 112 is not shielded by a channel stop 116. Consequently, the packet spreads from within channel 106 to the area underlying transfer gate 112 if the pocket thereunder is of the same depth, or is attracted there if the pocket thereunder is deeper than that under electrode 128 in channel 106. The charge packet is then attracted into the pocket underlying electrode 124 in channel 104 by the deeper potential well therein. The shape of the potential well which extends from under electrode 63 within a channel 74 to under an electrode 124 in channel 104 is illustrated by dashed line 134 in FIG. 9. The transferred charge is prevented from spreading into undesired areas by the potentials on electrodes 122 and 126 over channel 106 which prevent the charge from spreading out from under electrode 128 along channel 106, by the channel stop regions 116 which restrict the charge from spreading outside the area in alignment with channel 74 while passing under electrode 112, the potentials on electrodes 122 and 126 over channel 104 which prevent the charge from spreading out from under electrode 124 along channel 104 and by channel stop region 114 which prevents the charge from the spreading beyond channel 104.

When sufficient time has been allowed for the charges under electrodes 63 to migrate to channels 106 and 104, the voltages on transfer gates 110 and 112 are adjusted to eliminate potential wells thereunder or at least to make them shallow enough to prevent charge within channels 106 and 104 from migrating sidewise with respect to the lengths of those channels.

Electrode 110 has been described as having its potential varied to control the transport of charge thereunder. However, electrode 110 may be held at d.c. level, if that is a level which prevents charges in channel 106 from migrating to the area under electrode 110 during propagation within channel 106 and control potentials applied to the array control electrodes 60 are such that they will properly synchronize the transfer of charge into the area under electrode 110. Further, although the above description speaks in terms of creating a potential well under electrode 110 which is deeper than the one under electrode 63, the desired result may be obtained by raising the potential of electrode 63 so that the charge thereunder is attracted to the area under electrode 110.

The charge reception operation can be performed as a two step operation instead of as a one step operation by maintaining electrode 112 at an isolating potential while the transfer potential is applied to electrode 110 to transfer all the charge pockets of the first row to channel 106 and hold them there. If desired, this can be done with electrodes 124 and 128 at the same potential since no attraction of charge from under one of them to under the other is involved. After electrode 110 is returned to an isolating potential, a transfer potential is applied to electrode 112 to allow the charge packets in channel 106 which were received from channels 74 to transfer to channel 104. The transfer of the channel 74 packets from channel 106 to channel 104 must be done with electrodes 124 and 128 at potentials which will attract those charges from under electrodes 128 to the areas under electrodes 124. Electrode 112 is then returned to an isolating potential. Once electrode 112 has returned to the isolating potential, the conditions in the output circuitry are the same as they were at the end of the one step charge reception operation, i.e. after electrodes 110 and 112 were returned to isolating potentials.

From reference to FIG. 6 and in light of the foregoing description, it will be seen that each charge pocket transferred from a channel 74 is held within channel 104 under an electrode 124 and each charge packet transferred from a channel 76 is held within channel 106, also under an electrode 124. Thus, the charge in channels 104 and 106 can be propagated along channels 104 and 106, respectively, in unison and in the same direction by application of four-phase propagation voltages to the control electrodes of set 120.

Charges from both channel 104 and 106 will enter output region 140 at the end of channels 104 and 106 as they are propagated out of the end of channels 104 and 106. The channels will alternate in providing charge to the output region, the first packet of charge entering the output region 140 will come from channel 104 and the next packet of charge will come from channel 106. This alternate feeding of charge is imparted to the system by a combination of the orientation of output region 140 perpendicular to the direction of propagation in channels 104 and 106 and the offset nature of the electrodes between channels 104 and 106. This effect can also be obtained by other structures. The charge propagation rate in channels 104 and 106 is established at a value which allows each packet of charge to be removed from the output region 140 prior to the entry into that region of the succeeding packet of charge. In this way successive packets existing the output region come from alternate image frames (channels) and the packet of charge collected by a given charge collection element during the first frame and the packet of charge collected by that charge collection element during the second frame are adjacent to each other in the output stream. Whether the first or second frame packet from a given charge collection element is the first of that pair to pass through the output region depends on whether the CTD's 74 or 76 are used to store the first frame of charges.

Although the array has been described in the terms of having the fourth phase electrode split into two interdigitated combs, the concept of the structure is generalizable to greater numbers of splits for the electrode by utilizing an addition level of conductor so that three or more "combs" may be interleaved. The output structure can be generalized to a greater number (n) of output channels by providing additional transfer electrodes similar to electrode 112, additional channel stop regions similar to channel stops 116, propagation electrode offsets before each additional channel and by realigning the structure to hold every nth packet beginning with packet number 1 in channel 106, every nth packet beginning with packet number 2 in channel 104, every nth packet beginning with packet number 3 in the first additional channel and so on. The logistics of charge transfer from the array CTD's to the output CTD's in these expanded embodiments (n>2) are more complicated than in the preferred embodiment (n=2). However, the voltage control logistics can be simplified by dividing the transfer gates like 112 into separately controllable segments with each segment in alignment with an array CTD of a given group connected in common.

In the data collection operation of the preferred embodiment, there are only two locations in which charges from different image frames pass through the same region in succession, each of which is herein referred to as an overlap because the succeeding pocket will overlap the charges left behind by the preceeding pocket. This occurs once when the charge is transferred from channels 74 and 76 to channels 106 and 104 and a second time in the output region. In the first of those locations the charges contained in channels 74 pass through portions of channel 106 in getting to channel 104. This portion of channel 106 is subsequently traversed by the charges in channel 106 which came from channels 76. This successive propagation of alternate frame charges through the same region makes interframe charge smear (crosstalk) possible since the charge transfer efficiency of that operation is slightly less than 1. However, any charge smear between images from that transfer will be minimal since only one overlap is involved, whereas systems of similar size which don't use this parallel-parallel transfer system would have several hundred overlaps per array channel and within a single output charge transfer channel. Crosstalk may be further minimized if prior to applying the propagation voltages to channels 104 and 106, a voltage is applied to electrode 128 which will remove by recombination any charge retained in the area in channel 106 in alignment with channel 74.

In the second of the locations (output region 140) where charges from alternate frames pass through the same region, charge transfer inefficiencies will have a very minimal smearing effect if an acceptable transfer efficiency is obtained. Once again the smearing is minimal because there is only a single region (the output region 140) through which a given second frame packet follows a given first frame packet. If the output region exhibits a minimum transfer efficiency of 0.999, then at most 0.1% of the charge in the first packet to pass through region 140 will be left in that region to affect the next succeeding packet to pass through region 140. This introduces only a very small error. Further, the provision of two separate output regions (one for each of channels 104 and 106) would substantially increase the data collection errors because of differences in the actual gain of those output regions.

The data degradation induced at these two locations by successive transfer of alternate frame data therethrough makes a very slight amount of interframe crosstalk likely. However, as compared to systems which store both data frames from a given column of charge collection elements in the same CTD, the system of this invention is a fantastic improvement. In those systems, each transfer within the array induces interframe crosstalk. That is, if two packets from different frames were propagated down a channel in the array in successive CTD storage wells, the leading packet could leave (assuming 0.998 transfer efficiency) a maximum of 0.2% of its charge in each location along the channel. The effect of these charges would be cumulative and would create a much greater smear and data degradation than is possible in the present system. A single output region 140, even with the inherent possibility of a slight smear between charge packets from different frames, is preferred over two separate output regions because the difficulties of fabricating two identical output regions are much greater than the difficulties induced by the successive transfers through the single output region.

From the output region 140, the charge packets may be converted to a desired output form in any manner which is appropriate for CTD's. Appropriate output devices and circuits are well known in the art. Voltage outputs obtained through use of a field effect output device are preferred.

From output region 140, the data proceeds to the external utilization means 200 which may be designed to perform any desired operations on the data to obtain desired information therefrom. For changing image discernment, external utilization means 200 preferably includes differential amplifier means 204 and switching means 202 for routing first frame signals to a first input of the differential amplifier and second frame signals to a second input of the differential amplifier means. The differential amplifier provides output signals representative of the signed difference between the first and second frames on a pixel by pixel basis. Thus, the output signal resulting from the first packet arriving from channel 104 is preferably provided to the first input of a differential amplifier and the output signal resulting from the first packet of charge arriving from channel 106 is provided to the other input of that amplifier in order to generate a signal representative of any difference in the charge contained in these two packets which constitute the first and second frame charges collected by a single charge collection element, i.e. from a single pixel. If the image impinging on that charge collection element did not change from the beginning of the first integration time until after the end of the second integration time, then the charge in the two packets will be the same and the differential amplifier will provide a zero output. However, if the actinic intensity of the image impinging on that charge collection element changed between or during frames one and two, then the quantity of charge in the two packets will be different and the differential amplifier will provide a non-zero output representative of that difference in charge. Preferably the sense of the output of the differential amplifier depends on whether the charge from frame one is greater or less than the charge from frame two.

In this manner, any changes in the image from frame one to frame two which were detected by the buried charge collection elements associated with the first row of CTD charge storage cells will be discerned as the first row of charge packets loaded into channels 104 and 106 are propagated out. Once all of these charge packets have been transferred to the output region 140, the voltages applied to electrodes 110 and 112 and to set 120 of control electrodes are changed to charge reception voltages. Thereupon, the propagation voltages applied to propagation electrodes 60 of channels 74 and 76 (if previously stopped) are advanced one cycle to transfer the next column of charge packets into channels 106 and 104. The process of propagating charge out of channels 104 and 106 and advancing the charge in channels 74 and 76 is repeated until all of the charge packets of the first and second frames of the image have been transferred through the output region 140.

The voltages representing the individual pixel charge differences may be stored in analog or digital form or further processed to extract additional information therefrom, in accordance with the needs of the system or the information it is desired to acquire or retain.

Output region 140 which converts the CTD charge packets to non-CTD information forms is shown as being directly coupled to the output charge transfer channels 104 and 106 because that is the presently preferred embodiment. However, as the ability to perform signal processing directly within charge transfer devices develops and increases, it may become desirable to perform some data manipulations such as some data reduction before providing externally utilizable signals. Such processing could be done between the present ends of channels 104 and 106 and the output region 140, or possibly even within the array CTD's 70 or the output CTD's.

If the entire CTD output propagation sequence can be accomplished in a single charge integration time, as is preferred, then a new first charge integration time is begun as soon as the second frame of charges has been transferred from the charge collection elements to channel 76 and at the end of that new first charge integration time, a new first frame of integrated charge is transferred to channels 74, after which a new second frame is integrated in the buried charge collection structures and transferred to channels 76 at the end of that integration time. Once the new first and second frames are in CTD's 74 and 76, the CTD output propagation sequence is repeated to detect any image change or target movement during those frames.

If it is desired to perceive an entire image rather than a change in that image, the collected charges may be read out of the array after each frame is integrated and the charges handled as pixel intensity signals. Under such circumstances, it is not necessary to perform a frame to frame difference operation on the charges in the post-output processing circuitry since the desired output data is a complete image rather than data which emphasizes which parts of the detected image are changing. Thus, the major change which must take place is in the post-output processing of the data.

If the CTD output propagation sequence takes longer than a charge integration time, then any charge which has been accumulated in the charge collection elements during the output sequence should be removed prior to the beginning of the next image sensing sequence. This may be accomplished by applying CCE-to-CTD read potentials to electrodes 67 and electrodes 69 to transfer all charge from the buried collection structures to the channels 74 and 76. Once sufficient time has elapsed to assure depletion of the charge collection elements, the voltage applied to electrodes 67 and 69 is reduced to below the read threshold. That initiates the integration time for the new first frame. The unwanted charge in channels 74 and 76 may be disposed of in any of a number of ways. First, the voltages applied to the transfer electrodes 60 may be reduced to a level where the potential wells holding the charges cease to exist and the charges are released into the bulk of the device where they recombine. This technique has the disadvantage that the charge collection structures could attract some of the charge so released and would thus distort the next image frame. Consequently, the preferred method is to apply voltages to the electrodes 110, 112 and the electrodes of the control set 120 to form a single continuous potential well from the output position of the channels 74 and 76 to the output region 140 and then transfer the charge within the channels 74 and 76 to the channels 104 and 106. This charge transfer can be done very rapidly since there is no need to maintain the integrity of individual charge packets. Once all the charge has been transferred out of the channels 74 and 76, the voltage on transfer electrode 110 may be changed to one which isolates channels 74 and 76 from channel 106. Once channels 74 and 76 are isolated from channel 106, plenty of time is available in which to move any charge remaining in channels 104 and 106 to the output means 140, since all of the integration time for the new second frame and generally some portion of the first integration time remains to be consumed before new data will be ready to be transferred out of the array.

An alternative means of disposing of the charge is to utilize input means 98 as a charge drain and apply a backward propagation voltage sequence to the transfer electrodes of set 60 to propagate the charge backwards through those channels into input means 98. As a final enumerated alternative, a charge drain could be provided beyond channel 104 and the channel stop 114 changed to a transfer gate similar to transfer gates 110 and 112. To drain the charge, the transfer gate which replaced channel stop 114 would be held at a potential which caused any charge in channel 104 to flow to the charge drain. Many possible techniques are available for removing unwanted charge from the buried charge collection structures through the CTD system. Although the above discussion is exemplary of possible techniques, it is by no means exhaustive and those skilled in the art will be able to provide other charge elimination techniques without departing from the invention. Further, the accumulation of unwanted charge can be eliminated by preventing the image from striking the sensor array until a new first charge integration time is ready to begin. This may be achieved by mechanical, electro-optical or other shuttering means.

Utilizing charge transfer propagation rates on the order of 1.0965 kHz in channels 74 and 76 and a propagation rate of 125 kHz in channels 104 and 106, the two frames of image information may be propagated out of a sensor having a 110×110 array of buried charge collection structures in a period of about 0.1 seconds. Thus, special charge elimination techniques would only be needed with charge integration times which are less than about 0.1 second.

To obtain highest accuracy the period of time from the beginning of the first frame charge integration period until after the frame(s) have been transferred through output region 140 must be much less than the period of time required for the CTD potential wells to fill with thermally generated charge. Otherwise thermally generated charge may obscure the image to be sensed. Further, a semiconductor should be selected which will absorb substantially all of the incident image radiation before the radiation reaches a depth at which the photogenerated charges would be collected directly by the CTD. Accordingly, if deep penetrating radiation is expected which is not a desired portion of the image to be sensed, appropriate filtering should be utilized in order to minimize the interference induced by that radiation.

If long charge integration periods are needed because of the nature of the image being sensed, the sensor array may be cooled to the point where thermal charge generation is reduced to a value which is low enough that it does not affect the sensing of the image.

If it is desired to do so, the charges from the first and second frames may be merged to form a fabricated frame which is the sum of the first and second frames. So long as output channel 106 has sufficient charge storage and transport capacity, this can be done by performing the first step of a two step array-to-output-means-100 charge transfer wherein the charges from the first row of the array are transferred into channel 106 and the packets of charge from channels 74 are held under electrodes 128 in channel 106 and the packets of charge from channels 76 are held under electrodes 124 in channel 106. Then, rather than allowing the charges which came from channel 74 to pass under transfer data electrode 112, the voltages on the electrodes 126 are changed to increase the depth of the potential well thereunder and the voltages on the electrodes 124 are changed to decrease the depth of the potential well thereunder with the result that the charges under the electrodes 124 flow through the region under electrodes 128. This merges the two sets of charges from the first and second frames which result from the same pixel to form the new fabricated frame in which the charge for each pixel is the sum of the first frame charge and second frame charge for that pixel. These packets of charge are then read out of output channel 106 into output region 140 by applying four phase propagation voltages to the electrodes of transfer set 120. The operation is then repeated for each succeeding row of charges from the array until the entire fabricated frame has been read out.

The system of this invention has a very wide dynamic range for detection of target movement. This results from handling the charges generated by a first frame and the charges generated by a second frame in identical ways so that they undergo similar operations simultaneously to the greatest extent possible and are subtracted or compared prior to the determination of their quantity. All transfer operations except the transfer from channels 74 and 76 to channels 104 and 106 are designed to be as identical as possible. For the first frame and second frame charges collected by a given buried diode all transfers take place at the same time except for the transfers from the diode to channels 74 and 76 and from channels 104 and 106 through output region 140.

The dynamic range of this image sensor for entire image perception may be increased by detecting and storing two separate image frames, one in channels 74 and one in channels 76 prior to readout. A first of these two image frames (hereinafter sometimes referred to as the "short frame") may be integrated for a period of time which is close to the maximum integration time which may be permitted without the greatest actinic intensity pixel(s) flooding the charge collection element in alignment therewith whereby the charge collection becomes non-linear or spreads to adjacent pixels and thereby creates blooming. The other frame (hereinafter sometimes referred to as the "long frame") may be integrated for a substantially longer period than the just specified integration time. The "long frame" will suffer from non-linear charge collection and/or blooming in the vicinity of high actinic intensity pixels. However, the actual actinic intensity of low actinic intensity pixels which are sufficiently far removed from high actinic intensity pixels will be more accurately determined by the longer integration time. During data reduction, the values of actinic intensity obtained from the longer integration time may be utilized (with appropriate scaling, if needed) as representative of the actual actinic intensity of low-intensity pixels in order to obtain a high accuracy value for the actinic intensity of these pixels. The intensities determined by the short integration time may be utilized (again with appropriate scaling, if needed) as representative of the actual actinic intensity of the high intensity pixels. Which frame should be utilized for which pixels can be determined by utilizing an experimentally determined maximum value of indicated intensity from the "long frame" and any pixel having greater intensity than that threshold value in the "long frame" will have the value determined in the "short frame" utilized instead of the one from the "long frame". Alternatively, a low intensity threshold may be utilized on the "short frame" and for pixels the intensity of which falls below that value, the value obtained in the "long frame" may be utilized instead.

The selective transfer of charge from channel 106 to channel 104 may be accomplished by other structures than the one illustrated. For instance, the electrodes of set 120 may be made straight and the edges of the channel stop regions 116 which do not run parallel to the edges of the channels may be made at an angle so that the path available for charge flow between channels 106 and 104 runs at a non-perpendicular angle to the propagation direction of the channel. As a further alternative, the channel stops 116 may be placed only in alignment with the channel stops 72 of the array 70 and the offset electrodes illustrated utilized. Under those circumstances, the pocket inducing potentials applied to the electrodes 112, 124 and 128 would have to be such that the entire packet of charge from a channel 76 would be held within channel 106 under an electrode 124 in a manner which would prevent the spillage of charge over into the region under electrode 112. Those skilled in the art will be able to devise many ways of selectively transferring the charges originating in channels 74 to channel 104 while retaining the charges from channels 76 in channel 106.

If a modified version of the selective transfer system is utilized, then it may be necessary to modify the position or structure of the electrical output region 140 in order to retain the characteristics of the preferred system in which channels 104 and 106 provide charge to the output region alternately. Consequently, the illustrated structure is the preferred, but not exclusive, embodiment of the selective transfer system.

It will be understood, that if it were considered to be necessary, the passage of frame one charge through channel 106 on the way to channel 104 could be eliminated by causing channels 74 and 76 to propagate in opposite directions through the application of zig zag propagation electrodes. If this were done and the use of a single output region were still desired, the channels 104 and 106 would need to propagate charge initially in a direction perpendicular to the length of channel 74 and 76 and then parallel to the length of channels 74 and 76 to the common output region. Although such a structure may be feasible, it is felt that the single passage of the charge from a first image frame through the channel 106 introduces a minimal possibility of smear and that the alternate structure would have more disadvantages. Even in the event that there is a slight smearing resulting from the use of preferred structure, it is felt that the increased device yield and reduced complexity of the device and the lesser number of transfers required by the preferred device outweigh any benefits obtained from using the alternate structure.

The array and output charge transfer devices of the preferred embodiment may be utilized for memory purposes independent of the image sensing ability of the buried charge collection elements. Information may be introduced into the CTD's of the array via input system 98.

Alternatively, the output system 100 may be utilized as an input system either using output region 140 as an input region or by using input region 154 or 156 (or 150). The information thus inserted is propagated along an output channel such as 106 and transferred from that channel into the CTD's of the array. Good results are obtained by using the CTD's of the preferred embodiment as a dual frame memory in concert with a prior art type image sensor (which sequentially detects and reads out a single image frame prior to detecting a subsequent image frame) to form a system which operationally acts similar to the preferred embodiment. This may be accomplished by reading the image information out of that single-frame-at-a-time sensor, inserting it into an electronic input of an input (or output) CTD of the preferred embodiment and transferring that input to CTD channels 74 (or 76) of the array on a row by row basis in order to store the first frame of information in the CTD array in channels 74. Once that information is stored in the array, the electrodes 67 have a storage voltage applied thereto which maintains a deep enough potential well that the charges stored under electrode 67 will be unaffected by the application of transfer potentials to electrodes 61, 63, 65 and 69. Thereafter, charges representing a second image frame are obtained by the image sensor and provided to the input CTD and are transferred from it to the channels 76 (74) on a row by row basis with each row advancing across the array as the succeeding row is transferred from the input CTD to the channel 76 of the array while the charges in channels 74 remain stationary. When both frames of the image are stored in the CTD array of the preferred embodiment, the first and second image frame charges collected by a given element of the image sensor are stored in associated storage cells under associated electrodes 67 and 69 in associated (adjacent) CTD channels in a manner substantially identical to that described previously with respect to operation of the preferred embodiment utilizing its built-in imaging detecting abilities. Thereafter, the image information is read out on a row by row basis with the first frame being transferred to one of the output channels 104, 106 and the second frame information being transferred to the other of those channels. In this way, the differences between the first and second frames may be determined in a manner substantially the same as that utilized with the preferred embodiment utilizing its own image detecting capabilities.

The preferred embodiment is unique in its ability to process data in this manner since it is fabricated with identical channels which, because of the split fourth phase electrode, may have data from different frames interleaved in a manner that facilitates difference or change determinations on an element by element basis wherein the totality of charge transfer operations performed on each set of data is substantially identical thereby minimizing or eliminating charge differences which are a result of the charge storage system (rather than changes in the image or data between frames).

There are numerous ways in which a device in accordance with this invention may be fabricated. A preferred method of fabricating the device is to begin with a silicon wafer and grow the region 46 epitaxially thereon while continuously varying the doping level therein in order to create the grading profile of the region 46. The growth of the silicon epitaxial layer is then continued with a constant doping concentration in order to form the portion of the region 28 which falls between the region 46 and the p-n junction 57. If desired, this epitaxial growth may be interrupted for the fabrication of the charge collection elements 30 and isolation regions 32 by diffusion. However, it is preferred to provide these regions by ion implantation after the growth of the region 56 is complete. Thereafter, a second epitaxial region of opposing conductivity type is grown over the region 56 thereby forming the p-n junction 57. After the completion of the growth of the region 58, the charge transfer channel stop 72 may be provided by diffusion into the region 58 or by ion implantation into the region 58. The fabrication of the remainder of the device is straightforward in accordance with normal charge coupled device fabrication wherein the dielectric layer 50 is formed following which the first layer metallization is deposited and defined after which the second dielectric layer 78 is formed and the second layer of metallization is deposited thereon and defined. At an appropriate stage in the fabrication of the overall device, the thick region of the final device 24 is masked and the unmasked portion of the initial wafer is etched with a preferably crystallographically selective etchant to form a thin region 28 and a transistion region 26. The termination of the etching at the desired thickness for the thinner region 28 may be assured by making the original semiconductor substrate of opposite conductivity type to that of region 46 and utilizing an electrolytic etching technique which inherently becomes much slower upon encountering the opposite conductivity type region 46. The etching to form the thin region 28 should be performed at a point in the process where the structure which will remain in that region is self supporting for fabrication purposes, but may otherwise be performed at a point which is convenient to the fabrication process so long as detrimental effects to the device are avoided.

Many other fabrication processes may be utilized so long as they provide a structure which is operable.

The presently preferred embodiment which combines the imager and memory functions has the following approximate specifications:

Segment 28 has a thickness of 20–25 $\mu$m, a doping level of $\sim 1 \times 10^{18}$ cm$^3$ n-type at the back surface 19 and a doping level of $\sim 3 \times 10^{15}$ cm$^3$ n-type at the depth where the buried diodes are. Each image detection pixel is square and approximately 45.7 $\mu$m on a side. Each buried diode 30 is square and approximately 33 $\mu$m on a side. The heavily doped isolation regions 32 are approximately 6 $\mu$m wide and spaced approximately 3 $\mu$m from the diodes on either side thereof. The diodes have an approximate thickness of 0.5 $\mu$m as do the heavily doped isolation regions. The buried diodes are formed by ion implantation of boron with a dose of $\sim 8 \times 10^{11}$/cm$^2$ at 180 KeV at a 7° angle. The isolation regions 32 are formed by ion implanted phosphorus with a dose of $\sim 1 \times 10^{12}$/cm$^2$ at 180 KeV at a 7° angle. The regions 58 in which the buried channels form are produced by a boron implant of $1 \times 10^{12}$/cm$^2$ at 150 Kev at an angle of 7°. The channel stops are phosphorus doped by diffusion and have a resistance of $\sim 20$ $\Omega/\square$ and a width of $\sim 7$ $\mu$m. The channels have widths of approximately 16 $\mu$m. The lower level gates are $\sim 15$ $\mu$m wide and spaced from each other by $\sim 8$ $\mu$m and are approximately 0.5 $\mu$m thick heavily doped N-type polysilicon. The surface of these electrodes is oxidized to form the dielectric layer 78.

These devices may be used as combined imagers and memories or may be used as memories for separate one-frame-at-a-time imagers as discussed above.

The preferred embodiment has a planar focal surface, however, the focal surface may take any form which is convenient for the optical system with which it will be used, so long as that configuration is capable of being manufactured in an operable form.

The preferred embodiment utilizes silicon as the semiconductor material. However, other semiconductors such as germanium, gallium arsenide, other Group III-Group V compounds and other semiconductors and materials capable of supporting the necessary charge flow may be utilized instead of silicon. The conductivity types of the various regions may be reversed or modified if desired.

The preferred embodiment of this invention has been illustrated and described. However, although preferred, this embodiment is not the exclusive embodiment and those skilled in the art will be able to make many changes therein without departing from the scope of the invention as defined by the appended claims:

What is claimed:

1. An image sensor comprising:
   semiconductor means capable of supporting charge transfer device action;
   said semiconductor means being photosensitive to electromagnetic radiation having a wavelength within a predetermined range of interest and photogenerating charge carriers upon photoresponsive absorption of a photon having a wavelength within said predetermined range;

said semiconductor means having front and back surfaces;

said back surface adapted to receive image information in the form of electromagnetic radiation having wavelengths within said predetermined range;

a plurality of buried charge collection means for collecting and temporarily storing photogenerated charge carriers; and at least two line array charge transfer device means disposed along said front surface of said semiconductive means, wherein each of said at least two line array charge transfer devices means is capable of receiving photogenerated charge selectively and controllably transferred directly thereto from a selected one of said buried charge collection means, said charge transfer device means comprising:

dielectric means disposed on said front surface of said semiconductor means;

a first plurality of charge transfer device control electrode means constituting a first multiphase set disposed on said dielectric means for controlling the transport of charge in a first one of said at least two charge transfer device means;

a second plurality of charge transfer device control electrode means constituting a second multiphase set disposed on said dielectric means for controlling the transport of charge in a second one of said at least two charge transfer device means;

a plurality of charge transfer channel separation means dividing the portion of said semiconductor means in the vicinity of said front surface into at least first and second charge transfer channels, wherein the transport of charge in said first charge transfer channel is controlled by said first plurality of control electrode means and wherein the transport of charge in said second charge transfer channel is controlled by said second plurality of control electrode means;

wherein said first and said second charge transfer channels are each capable of receiving photogenerated charge selectively and controllably transferred thereto from said selected one of said buried charge collection means;

wherein a selected one of said first plurality of charge transfer device control electrode means is capable of transferring a first packet of photogenerated charge from said selected one of said buried charge collection means into said first charge transfer channel;

wherein a selected one of said second plurality of charge transfer device control electrode means is capable of transferring a second packet of photogenerated charge from said selected one of said buried charge collection means into said second charge transfer channel;

wherein said first packet of photogenerated charge may be collected in said selected one of said buried charge collection means over a first time interval distinct from a second time interval in which said second packet of photogenerated charge is collected in said selected one of said buried charge collection means; and output means for converting charge transported within said charge transfer channels to externally utilizable signals;

wherein said charge collection means is disposed a predetermined distance from said front surface of said semiconductor means, said predetermined distance being large enough to minimize undesired charge communication between charge on said charge collection means and charge in said charge transfer device means and small enough to enable photogenerated charge carriers collected by said charge collection means to be controllably transported from said charge collection means to said charge transfer device means for transportation from said charge collection means to said output means.

2. The image sensor recited in claim 1 wherein said selected one of said first plurality of charge transfer device control electrode means and said selected one of said second plurality of charge transfer device control electrode means constitute a split electrode included in both said first and said second plurality of charge transfer device control electrode means.

3. The image sensor recited in claim 2 wherein:

each charge collection means is capable of selectively and controllably transferring photogenerated charge packets directly to at least two of said at least two line array charge transfer device means.

4. The image sensor recited in claim 3 wherein:

there are two of said charge transfer device means disposed to receive charge directly from each charge collection means; and said output means combines the signal from the two charge transfer device means which received charge directly from a given charge collection means and provides an output signal having a value which is representative of the difference in the quantity of charge received directly by said two of said charge transfer device means from said given charge collection means.

5. The image sensor recited in claim 4 wherein said charge collection means are disposed in a rectangular array thereby dividing the image to be sensed into a corresponding array of image elements.

6. A charge transfer device array comprising:

a plurality of array charge transfer channels aligned parallel to a first direction, said array channels separated by first channel stop means, said plurality comprising a first plurality of array channels interleaved with at least a second plurality of array channels;

a multiphase set of array CTD charge transfer control electrodes disposed for controlling the potentials within said array channels, wherein said plurality of array charge transfer channels and said multiphase set of array CTD charge transfer control electrodes constitute a plurality of array charge transfer devices;

wherein control electrodes of at least one phase of said set of array CTD charge transfer control electrodes constitute at least two subsets of electrodes interdigitated with each other, a first subset of electrodes controlling the potential within the portions of said first plurality of array channels thereunder and a second subset of electrodes controlling the potential within the portions of said second plurality of array channels thereunder;

at least first and second output charge transfer devices, each having an output channel aligned substantially parallel to a second direction which is substantially perpendicular to said first direction;

said first output CTD adapted to accept charge from said first plurality of array channels;

said second output CTD adapted to accept charge from said second plurality of array channels;

wherein said plurality of array channels are free of channel stops therein; and wherein said first subset of electrodes are capable of selectively controlling the potential within said first plurality of array channels to selectively transfer charge along said first plurality of array channels independently of charge transfer along said second plurality of array channels.

7. The charge transfer device array recited in claim 6 including:

array CTD to output CTD transfer control means comprising:

first transfer gate means aligned parallel to said second direction and disposed between the array CTD's and the output CTD's, said first transfer gate means being capable of isolating the array CTD's from the output CTD's or enabling charge transfer between the array CTD's to the output CTD's in accordance with the voltages applied to said first transfer gate means;

the channel of said first output CTD positioned where it is in charge communication with said array CTD's when said first transfer gate means enables charge transfer between said array CTD's and said first output CTD, the channel of said second output CTD spaced from said channel of said first output CTD by second channel stop means, said second channel stop means comprising:

fixed channel stop means isolating said first and second output CTD's in alignment with said first CTD's of said array;

second transfer gate means disposed to control the potential in the regions between said first and second output CTD's where they are not isolated by said fixed channel stop means, said second transfer gate means being capable of isolating said first and second output channels from each other upon application of a first voltage thereto and of enabling charge communication between said first and second output channels in regions not in alignment with said first plurality of array channels upon application of a second voltage thereto;

third channel stop means bounding said second output CTD channel on the side thereof which is away from said second channel stop means;

output CTD transfer control electrodes disposed over said output CTD channels for controlling the potentials within the channels of the output charge transfer devices, said output CTD transfer control electrodes having, over said first output CTD channel, first phase electrodes in alignment with said first plurality of array channels third phase electrodes in alignment with said second plurality of array channels, second phase electrodes between said first and third phase electrodes and fourth phase electrodes between said third phase electrodes and the first phase electrodes of the next period of the output CTD transfer control electrodes, and over said second output channel, first phase electrodes in alignment with areas of the underlying channel which are in charge communication with the portions of the first output channel underlying said third phase electrodes of said output CTD transfer control electrodes upon application of said second voltage to said second transfer gate means.

* * * * *